US010430092B1

United States Patent
Wu et al.

(10) Patent No.: US 10,430,092 B1
(45) Date of Patent: Oct. 1, 2019

(54) MEMORY CONTROLLER SYSTEMS WITH NONVOLATILE MEMORY FOR STORING OPERATING PARAMETERS

(71) Applicant: Rambus Inc., Sunnyvale, CA (US)

(72) Inventors: Shih-ho Wu, Thousand Oaks, CA (US); Christopher Haywood, Thousand Oaks, CA (US)

(73) Assignee: Rambus Inc., Sunnyvale, CA (US)

( * ) Notice: Subject to any disclaimer, the term of this patent is extended or adjusted under 35 U.S.C. 154(b) by 166 days.

(21) Appl. No.: 14/444,225

(22) Filed: Jul. 28, 2014

(51) Int. Cl.
*G06F 12/00* (2006.01)
*G06F 3/06* (2006.01)
*G11C 14/00* (2006.01)
G11C 16/04 (2006.01)

(52) U.S. Cl.
CPC .......... *G06F 3/0625* (2013.01); *G06F 3/0659* (2013.01); *G06F 3/0679* (2013.01); *G11C 14/0063* (2013.01); G11C 16/0408 (2013.01)

(58) Field of Classification Search
CPC .... G06F 12/0246; G06F 3/0679; G06F 3/067; G06F 9/5016; G11C 16/102
See application file for complete search history.

(56) References Cited

U.S. PATENT DOCUMENTS

| | | | | |
|---|---|---|---|---|
| 7,457,880 B1 * | 11/2008 | Kim | ................... | G06F 17/30171 709/216 |
| 7,627,730 B1 * | 12/2009 | Moll | ..................... | G06F 13/161 710/100 |
| 2004/0255283 A1 * | 12/2004 | Rudelic | ..................... | G06F 8/65 717/151 |
| 2005/0223271 A1 * | 10/2005 | Butterworth | ........ | G06F 11/2082 714/6.3 |
| 2005/0251617 A1 * | 11/2005 | Sinclair | ................... | G06F 3/061 711/103 |
| 2008/0177936 A1 * | 7/2008 | Lasser | ................. | G06F 12/0246 711/103 |
| 2008/0184072 A1 * | 7/2008 | Odlivak | ............. | G06F 11/3644 714/32 |
| 2009/0198876 A1 * | 8/2009 | Lai | ........................ | G06F 13/124 711/103 |
| 2010/0180068 A1 * | 7/2010 | Matsumoto | ......... | G06F 11/1441 711/103 |
| 2011/0066790 A1 * | 3/2011 | Mogul | .................. | G06F 12/023 711/103 |
| 2012/0072771 A1 * | 3/2012 | Douceur | ............. | G06F 11/1441 714/22 |

(Continued)

OTHER PUBLICATIONS

Roger Fan, SMBus Quick Start Guide, Freescale.co, Rev. 1, Aug. 2012; http://cache.freescale.com/files/32bit/doc/app_note/AN4471.pdf.*

*Primary Examiner* — Ryan Bertram
*Assistant Examiner* — Trang K Ta
(74) *Attorney, Agent, or Firm* — Lowenstein Sandler LLP

(57) ABSTRACT

The present invention is directed to computer storage systems and methods thereof. In an embodiment, a memory system comprises a controller module, a nonvolatile memory, and a volatile memory. The controller module operates according to a command and operation table. The command and operation table can be updated to change the way controller module operates. When the command and operation table is updated, the updated table is stored at a predefined location of the nonvolatile memory. There are other embodiments as well.

20 Claims, 5 Drawing Sheets

(56) References Cited

U.S. PATENT DOCUMENTS

| | | | |
|---|---|---|---|
| 2012/0203956 A1* | 8/2012 | Wakasa | G06F 3/121 |
| | | | 711/103 |
| 2013/0007332 A1* | 1/2013 | Teh | G06F 13/4022 |
| | | | 710/313 |
| 2013/0117499 A1* | 5/2013 | Shao | G06F 12/1425 |
| | | | 711/103 |
| 2013/0254457 A1* | 9/2013 | Mukker | G06F 11/1441 |
| | | | 711/103 |
| 2014/0223231 A1* | 8/2014 | Mangold | G11C 16/16 |
| | | | 714/22 |
| 2015/0058535 A1* | 2/2015 | Lasser | G06F 12/0246 |
| | | | 711/103 |
| 2015/0277894 A1* | 10/2015 | Pirvu | G06F 21/575 |
| | | | 717/168 |

* cited by examiner

MEMORY CONTROLLER SYSTEMS WITH NONVOLATILE MEMORY FOR STORING OPERATING PARAMETERS

CROSS-REFERENCES TO RELATED APPLICATIONS

NOT APPLICABLE

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention is directed to computer storage systems and methods thereof.

Over the last few decades, the use of communication networks exploded. In the early days Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily, and that number is growing. With such high demands on data and data transfer, existing data communication systems need to be improved to address these needs. Companies built large server farms, where large numbers of computers together provide computational power to remote clients. Speed and reliability are two important aspects of server computers. Also, flexibility and serviceability are important.

Over the past, conventional techniques have been proposed to improve computer reliability. Unfortunately, these conventional techniques inadequate, as explained below. Therefore, improved system and methods for data reliability are desired.

BRIEF SUMMARY OF THE INVENTION

The present invention is directed to computer storage systems and methods thereof. In an embodiment, a memory system comprises a controller module, a nonvolatile memory, and a volatile memory. The controller module operates according to a command and operation table. The command and operation table can be updated to change the way controller module operates. When the command and operation table is updated, the updated table is stored at a predefined location of the nonvolatile memory. There are other embodiments as well.

According to an embodiment, the present invention provides a memory system that includes a non-volatile memory, which comprises a data area and a metadata area. The metadata area is predefined to store system parameters and a first table. The system also includes a volatile memory. The system additionally includes a backup power module. The system includes a controller module that includes a communication interface and a memory block for storing the first table. The first table comprises executable commands and operations. The controller module is configured to execute the commands and operations. The communication interface is configured to receive updates for changing the executable commands and operations. The updates is stored at the metadata area and the first table.

According to another embodiment, the present invention provides a method for initializing a memory system. The method includes powering on the memory system. The method additionally includes checking an indicator to determine if a first table has been updated. The first table comprising executable commands and operations. If the first table has been updated, the first table is loaded from a nonvolatile memory module to a controller module memory; if the first has not been updated, the first table is loaded from a hardwired location to the controller module memory. The method further includes operating the memory system using the first table.

According to yet another embodiment, the present invention provides a method for changing commands and operations for a memory system. The method includes operating a controller module using at least a first table stored at a first memory location. The first table includes executable command and operations. The method includes receiving a request of updating the first table. The method also includes setting an indication of updating the first table in response to the request. The method further includes receiving data for updating the first table. The method additionally includes checking a validity of the data. Furthermore, the method includes using the data to store an updated first table to the first memory location. The method includes operating the memory controller using at least the updated first table.

It is to be appreciated that embodiments of the present invention provides numerous advantages over existing systems. Compared to existing FPGA based systems, embodiments of the present provide better flexibility and faster speed. For example, since an FPGA does not have an integrated memory buffer of isolated controller, FPGA based implementations rely on switches to share the command/address and data buses with the host controller and C/A (command/address) buffer. Existing FPGA implementations also require additional program flash for the FPGA itself. As a result, FPGA based implementations, in comparison to isolated controllers according to embodiments of the present invention, have higher number of components, consume more power, and take up more real estate on a space limited NVDIMM. There are other benefits as well.

DETAILED DESCRIPTION OF THE INVENTION

Figure 1:
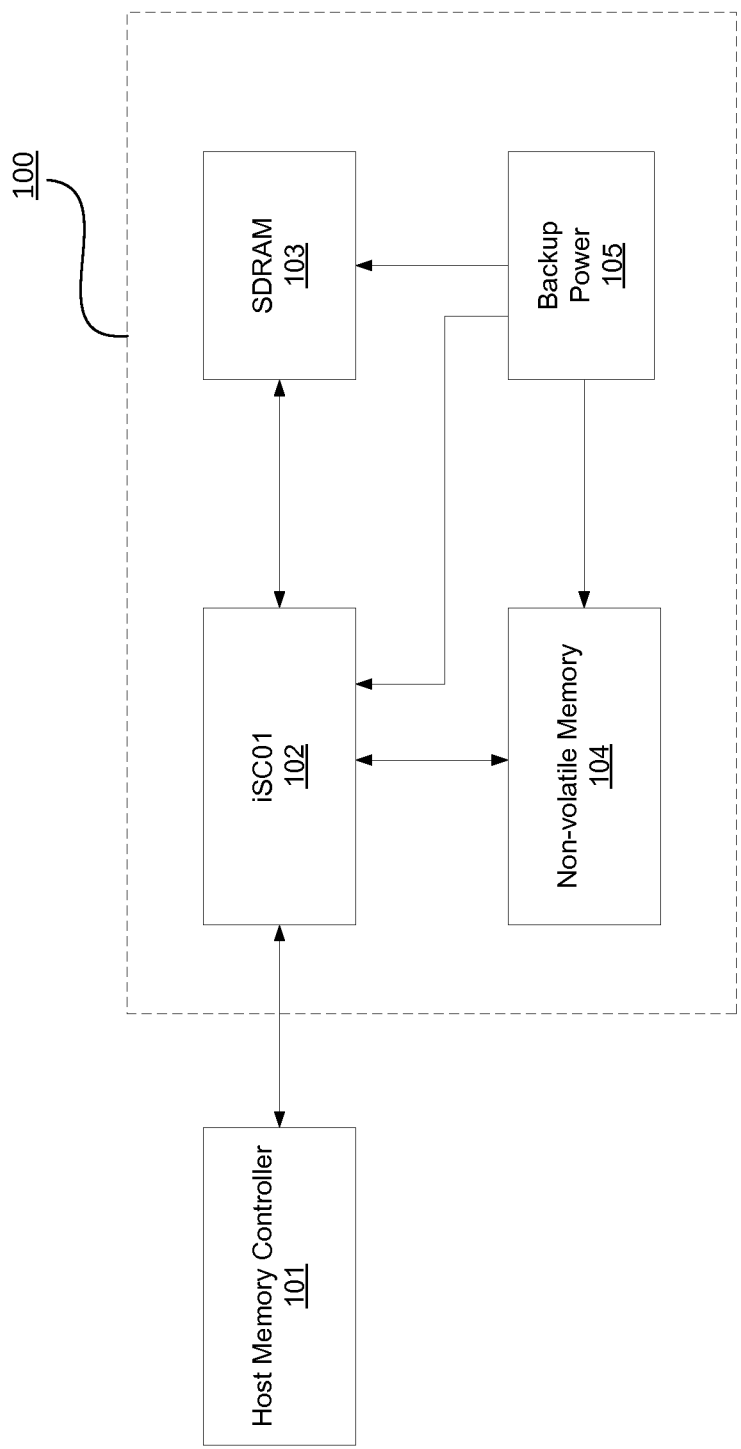
FIG. 1 is a simplified diagram illustrating an iSC controller system according to an embodiments of the present invention.

The present invention is directed to computer storage systems and methods thereof. In an embodiment, a memory system comprises a controller module, a nonvolatile memory, and a volatile memory. The controller module operates according to a command and operation table. The command and operation table can be updated to change the way controller module operates. When the command and operation table is updated, the updated table is stored at a predefined location of the nonvolatile memory. There are other embodiments as well.

As explained above, providing reliability is an important aspect of data servers and other applications. For example, power failure is a common scenario where unsaved information is lost. When information is stored in non-volatile memory, the amount of data loss is often small, and sometimes negligible. With server applications, where large amount of data, if not all the data, is stored in volatile memory (e.g., SDRAM) for speed, data loss can be catastrophic in the event of power or system failure. As an example, mechanism for backing up volatile memory data and operating parameters of memory system is described in U.S. patent application Ser. No. 14/316,707, filed Jun. 26, 2014, entitled "MEMORY CONTROLLER SYSTEM WITH NON-VOLATILE BACKUP STORAGE", commonly owned and assigned, which is incorporated by reference herein for all purposes.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

Embodiments of the present invention provides an isolation storage controller (iSC) system that includes a non-volatile DIMM memory (NVDIMM) that includes both volatile memory and non-volatile memory, where the non-volatile memory is specifically configured to preserve information stored at the volatile memory in the event of power or other types of failures. The iSC system is capable of selectively backup and restore the content of the volatile memory, and to determine the integrity of the information stored at the non-volatile memory. For example, non-volatile memory is implemented using flash memory and volatile memory is implemented using SDRAM, but it is to be understood that other types of components may be used as well.

The iSC system includes a controller module, as described in details below. In various implementations, the controller module operates independently when a host controller is not operational (e.g., in power failure scenarios), and facilitates operation of host controller during normal operation (e.g., provide memory functions for the host). The controller module comprises a number of registers, which store various settings and operating parameters of the controller module. According to embodiments of the present invention, on-chip command and operations of the controller module, which in turn affects the operation of the iSC system, can be modified by changing register values. For example, the register values are stored as metadata.

FIG. 1 is a simplified diagram illustrating an iSC controller system according to an embodiments of the present invention. This diagram is merely an example, which should not unduly limit the scope of the claims. One of ordinary skill in the art would recognize many variations, alternatives, and modifications. As shown in FIG. 1, an iSC system 100 is connected to the host memory controller 101. For example, the host memory controller 101 uses the iSC system 100 as a non-volatile DIMM (NVDIMM) module that is capable of preserving data in failure scenarios. The iSC system 100 includes a controller module iSCO1 102, a volatile memory 103 (e.g., SDRAM), a non-volatile memory 104 (e.g., flash memory, SSD, etc.), and a backup power 105.

The controller module 102 is connected to other modules of the iSC system 100 via its interfaces. The controller module iSCO1 102 comprises a host Interface, an SDRAM interface, and a non-volatile memory interface. In various implementations, the host interface of the controller module 102 connects to system memory host controller 101 through a DIMM edge connector. Depending on the application, other connections between the host interface and the host memory controller 101 can be used as well. The SDRAM interface of the controller module 102 connects to SDRAM 103. For example, the SDRAM 103 may include a number of memory modules, and the controller module 102 can be connected to the SDRAM 103 via various types of bus lines. For example, the host interface and SDRAM interface of the controller module perform load-reduction memory buffer (MB) operation. Also, other types of volatile memory device can be used as well.

The controller module 102 may include additional connections not shown in FIG. 1. In certain implementations, the controller module 102 comprises a system interface for communicating with external systems for updating its operations. More specifically, operations of the controller module 102 can be changed by changing the operating parameters, as described below in more details.

The non-volatile memory interface connects the controller module 102 to a non-volatile memory 104. Non-volatile memory 104 can be implemented using various types of devices, such as flash memory, solid state disk, and/or others. The non-volatile memory 104 is shown as a part of the iSC system 100, but it can be implemented using external storage devices. For example, the non-volatile memory 104 can be a part of the server storage and external to the iSC system 100.

In a specific embodiment, the non-volatile memory 104 has a capacity greater than the volatile memory module 103 and is thus able to preserve the entirety of information stored at the volatile memory module 103. The interface between the controller module 102 and the non-volatile memory 104 is high-speed and low-latency. In a specific embodiment, a SATA interface, which can provide a bandwidth of 6 Gbps, is used to implement the non-volatile memory interface of the controller module 102. For example, the SATA interface is used to preserve SDRAM content (e.g., backup image) during a system power failure situation. The non-volatile memory interface of the controller module 102 can be implemented using other types of bus interfaces as well, such as PCI Express, and others.

As shown in FIG. 1, the controller module 102 is electrically coupled to a power backup 105. Depending on the application, the backup power 105 may store enough power for sustaining the iSC system 100 through short power failure. In certain embodiments, the backup power 105 has enough power to allow data stored at the volatile memory 103 to be saved to the non-volatile memory 104. In various embodiments, the backup power 105 is constantly recharged.

In addition to power failures, there can be different types of situations or events that trigger backing up the content stored at the volatile memory to the non-volatile memory. For example, the backing up process is triggered by a predetermined "SAVE" event. When a SAVE event trigger (e.g., due to system power failure or software initiated) is received, the controller module 102 performs SDRAM reads and saves SDRAM content to the non-volatile memory 104 through its non-volatile memory interface. Since the non-volatile memory 104 retains data without power, the volatile memory content is preserved even when the system completely loses power. For example, the backup power 105 of the iSC system 100 can be implemented as a temporary power source, such as a super capacitor. The backup power 105 supplies the power needed for the SAVE operation. Once the SAVE operation is complete the backup power is no longer needed. According to various embodiments, the specific operations (e.g., SAVE operation and RESTORE operation) and behaviors of the controller module 102 can be modified by changing various operating parameters of the controller module 102. For example, a predetermined set of parameters of the controller module 102 are part of executable commands.

It is to be appreciated that the non-volatile memory 104, operating in conjunction with the controller module 102, is configured to store contents of the volatile memory 103 and system settings and parameters. In a specific embodiment, the non-volatile memory 104 has a storage capacity that is multiple size of the volatile memory 103, and thus is capable of storing more than one instance of the volatile memory content.

The content stored at the non-volatile memory can be restored back to the volatile memory. In various embodiments, after system power is restored, a "RESTORE" event trigger is sent to the controller module 102. The RESTORE operation restores volatile memory content using the saved image stored at the non-volatile memory through the volatile and non-volatile interfaces of the controller module 102. For example, the SAVE and RESTORE operation performed by the iSC system 100 does not need participation from the host system (e.g., host memory controller 101). From system perspective, the content of the volatile memory is intact and the non-volatile memory appears to be non-volatile. In addition, system parameters and/or settings may be loaded from the non-volatile memory during the RESTORE operation.

It is desirable and sometimes necessary to have system or chip configuration parameters preserved over a loss of power to the system or chip. One such example is the CMOS RAM in a traditional PC design. It contains critical configuration parameters for system boot. Its content is preserved by a small button or rechargeable battery so it remains persistent over a power loss event.

The SAVE and RESTORE operations described above are a simplification. For reliability purposes, many things happen when data are transferred between the non-volatile memory 104 and the volatile memory 104. When the non-volatile memory 104 saves the content of volatile memory 103, the controller module 102 also saves relevant system information and configuration parameters to the metadata field of the non-volatile memory 104. When the controller module 102 retrieves information from the non-volatile memory 104 to restore the volatile memory, the controller module 102 first processes the information stored at the metadata field of the non-volatile memory 104.

It is to be appreciated that the preservation of configuration parameters and system information over a power loss event is important to the operation of the controller module 102 and the iSC system 100 as a whole. The SAVE and RESTORE operations are to be performed autonomously while the system host controller (e.g., host memory controller 101) may have lost its power and/or is not yet operational. To accomplish this, the iSC system 100 uses a metadata scheme that does not require battery backup.

The controller module 102 manages the non-volatile memory 104 and reserves a predetermined number of data blocks (e.g., 512-byte sectors) in the metadata area of the non-volatile memory 104. According to various implementations, the metadata area is hidden and not accessible for user data (e.g., content of volatile memory 103, or SDRAM images) storage. Typically, critical volatile memory parameters (e.g., latencies, frequencies, organization, etc.) and important control and status data are saved to the metadata area of the non-volatile memory 104. In contrast, these parameters are typically stored in the chip registers of conventional systems. For example, the metadata area is updated with various system and volatile memory parameters during system initialization, at the beginning and the end of a SAVE or RESTORE operation, or when power loss is detected.

In various embodiments, metadata stored at the non-volatile memory include various control module parameters that can affect the operations of the controller module 102. For example, the controller module 102 parses some of parameters when executing various controller function, which is described below.

To provide an example, after a power-on reset, the controller module 102 establishes communication with the non-volatile memory 104 and searches for valid metadata. If valid metadata is found, the controller module 102 restores its corresponding internal registers with the metadata content. It is to be appreciated that these registers of the controller module 102 are effectively persistent, as their content survives power loss events.

As explained above, the system 1 operates as an NVDIMM. Instead of the isolated controller implementation illustrated in FIG. 1, other implementations as possible as well, according to existing techniques. For example, field-programmable gate array (FPGA) can be used in implementing NVDIMM systems. It is to be appreciated that embodiments of the present invention offer numerous advantages over existing FPGA based implementations. For example, since an FPGA does not have an integrated memory buffer of isolated controller, FPGA based implementations rely on switches to share the command/address and data buses with the host controller and C/A (command/address) buffer. Existing FPGA implementations also require additional program flash for the FPGA itself. As a result, FPGA based implementations, in comparison to isolated controllers according to embodiments of the present invention, have higher number of components, consume more power, and take up more real estate on a space limited NVDIMM.

Additionally, NVDIMM systems implemented according to embodiments of the present invention provides performance advantages over FPGA based NVDIMM systems. In FPGA implementations, insertion of switches in the high speed command/address and data paths causes degradation of signal integratity, which consequently limits the maximum memory speeds (or frequency) that they can operate. As an example, for DDR3 NVDIMM the FPGA-based NVDIMM speeds is limited to DDR3-1333 or lower. In contrast, isolated controller based NVDIMM systems according embodiments of the present invention can run at maximum speed of DDR3-1866, represents a 40% performance advantage over the FPGA-based implementation in system memory access. There are other benefits as well.

Figure 2:
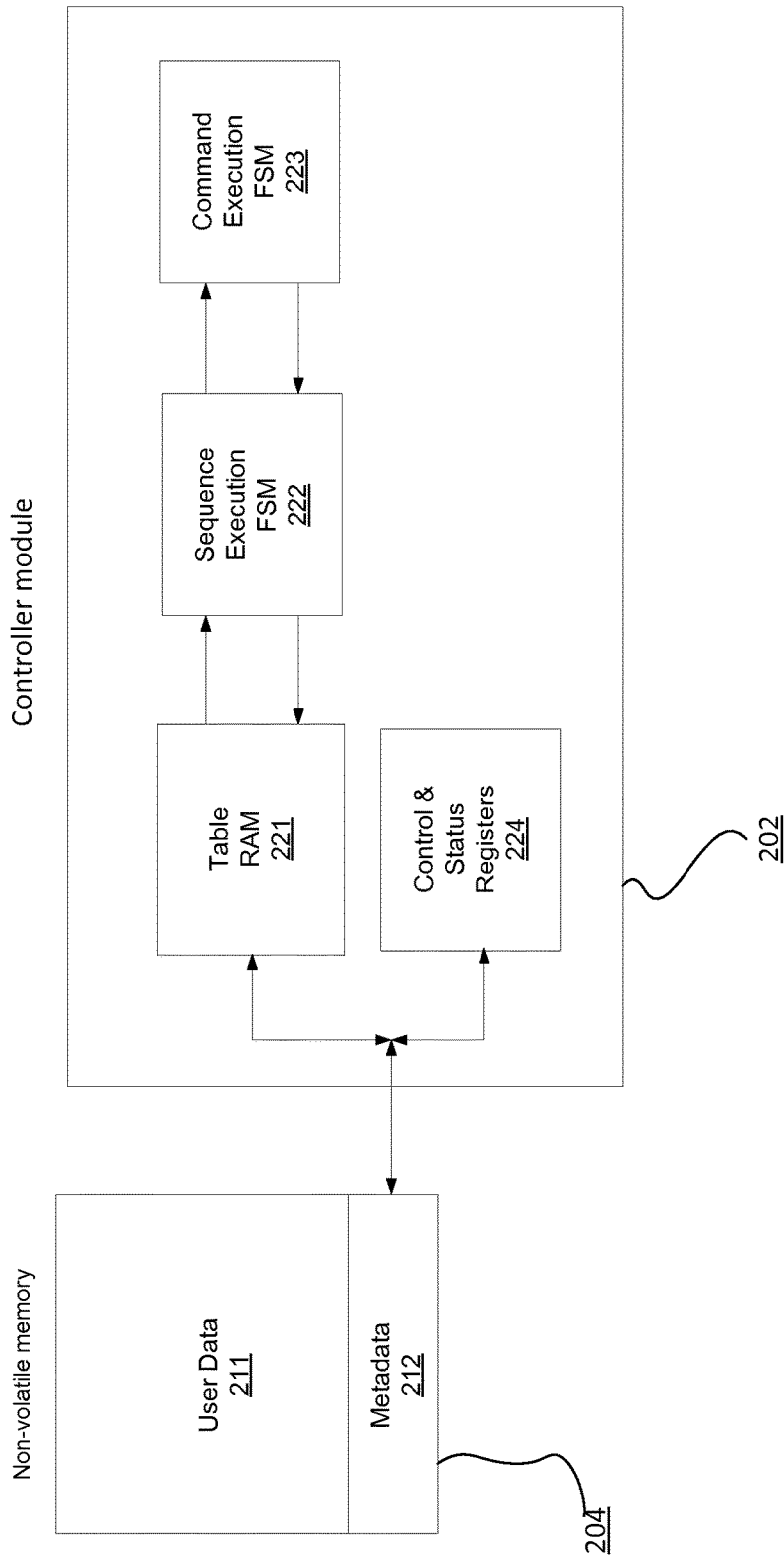
FIG. 2 is a simplified diagram illustrating operation of a controller module according to an embodiment of the present invention.

FIG. 2 is a simplified diagram illustrating operation of a controller module according to an embodiment of the present invention. This diagram is merely an example, which should not unduly limit the scope of the claims. One of ordinary skill in the art would recognize many variations, alternatives, and modifications. As shown in FIG. 2, the controller module 202 interfaces with the non-volatile memory 204. For example, the controller module 202 may be implemented using the controller module 102 in FIG. 1; the non-volatile module 204 may be implemented using the non-volatile memory 104 in FIG. 1.

As shown in FIG. 2, the non-volatile memory 204 comprises a user data area 211 and a metadata area 212. The metadata area 212 is predefined with data fields for storing various parameters related to components (e.g., controller module, volatile memory, etc.) of the iSC system. The user data 211 is configured to store one or more instances of volatile memory content. As explained above, the non-volatile memory 204 may be implemented using an external storage, and may thus store other information.

The controller module 202, as shown in FIG. 2, includes a table RAM 221, sequence execution finite state machine (FSM) 222, command execution FSM 223, and a registers 224. The operation of the controller module 202 is executed by the command execution FSM 223. Operation parameters and states of the FSMs of the controller module 202 are stored at the registers 224 and continuously updated as the controller module 202 operates. In power failure or similar situations, the controller module 202 sends the content of the registers 224 and other relevant information to the non-volatile memory 204, and non-volatile memory 204 stores them in the metadata area 212.

It is to be appreciated that the content of the metadata area 212 helps restore functionalities of the iSC system. For example, the controller module 202 uses the metadata area 212 to backup register values and various parameters needed to resume operation. In addition, as explained below, the metadata area has data blocks for checking validity of the content stored at the data area 211 and the metadata area 212.

It is to be appreciated that the content of the metadata area includes register values of the controller module, and these register values, in addition to providing operational settings, can be used to change how instructions of the controller module is executed.

Table 1 below shows the content stored at the metadata area according to an implementation. It is to be appreciated the metadata content may be implemented in other ways as well.

TABLE 1

| Name | Offset | Description |
|---|---|---|
| Signature Low | 'h0000 | Lower 16 bits of the NV Signature register |
| Signature High | 'h0002 | Upper 16 bits of the NV Signature register |
| NV Status 0 | 'h0004 | 16-bit NV Status 0 register value |
| Brownout Count | 'h0006 | 16-bit Brownout Count register value |
| Start Address | 'h0008 | 16-bit Start Address register value |
| End Address | 'h000A | 16-bit End Address register value |
| LBA0 Low | 'h000C | 16-bit LBA0 Low register value |
| LBA0 Mid | 'h000E | 16-bit LBA0 Mid register value |
| LBA0 High | 'h0010 | 16-bit LBA0 High register value |
| LBA1 Low | 'h0012 | 16-bit LBA1 Low register value |
| LBA1 Mid | 'h0014 | 16-bit LBA1 Mid register value |
| LBA1 High | 'h0016 | 16-bit LBA1 High register value |
| Scratchpad0 | 'h0018 | 16-bit Scratchpad0 register value |
| Scratchpad1 | 'h001A | 16-bit Scratchpad1 register value |
| NV Debug 0 | 'h001C | 16-bit NV Debug 0 register value |
| NV Debug 1 | 'h001E | 16-bit NV Debug 1 register value |
| NV Debug 2 | 'h0020 | 16-bit NV Debug 2 register value |
| SDRAM control | 'h0022-003F | SDRAM parameters such as latencies, frequencies, and organization |
| Context 1 Training | 'h0040- 006F | SDRAM training parameters for context 1 |
| Context 2 Training | 'h0070-009F | SDRAM training parameters for context 2 |
| Context 3 Training | 'h00A0-00CF | SDRAM training parameters for context 3 |
| Context 4 Training | 'h00D0-00FF | SDRAM training parameters for context 4 |
| Table RAM | 'h0100-02FF | Operation and command table data. |

As shown in Table 1, the content includes status, count, address, and management data. The "Signature Low" and "Signature High" data are used to validate metadata. For example, the metadata area and the use thereof provide a fail-safe mechanism for status register. Additionally, the metadata area, as defined in Table 1, can store debugging information. Among other things, saving the content of debug registers in the metadata provides a benefit of making debug and workaround settings sticky, and therefore the settings do not need to be re-applied after power cycle or chip reset. Similar benefits apply to the control and address registers.

In an implementation, two 16-bit registers are used to form a 32-bit NV Signature register. The Signature value in this register is stored as a part of the metadata saved after a successful SAVE or RESTORE operation. In a power-on reset operation, the Signature value is retrieved from metadata area of the non-volatile memory and is compared to a hardwired value to determine if the metadata is valid. If the Signature (and hence the metadata) is valid, the controller module loads the metadata into its internal control and status registers to restore the configuration for future SAVE and RESTORE operations. If the Signature is not valid, the controller module initializes the SSD/Flash memory and writes metadata to it. For example, writing a value different from the hardwired value to the NV Signature register causes the next signature comparison to fail and render stored metadata invalid.

The information stored at the metadata area also facilitates selective storage of volatile memory content. The "Start Address" and "End Address" data are pointers defining the location where the content of volatile memory is stored. Depending on the implementation, the data rea of the non-volatile memory may store only a portion of the volatile memory content or multiple instance of the volatile memory content (e.g., providing capability to restoring to earlier states), and the "Start Address" and "End Address" allocate the storage space for these data.

Since multiple instances of the volatile memory content may be stored, more than one sets of pointers may be needed. For example, the "LBA0" set of pointers are directed to the location of a first instance of volatile memory content, while the "LBA1" set of pointers are directed to the location of a second instance of volatile memory content, and so on and so forth.

Often, for debugging and logging purposes, it may be advantageous to store information related to the operation conditions of the iSC system. For example, the "Scatchpad0" and "Scatchpad1" data store information that may be used for firmware version control, debugging, and/or other purposes. Similarly, the "NV Debug" registers store debugging information, which can be used to change operation and behavior of the iSC system.

The controller module interfaces the volatile memory and controls its operations. To do so effectively, the controller module may rely on the specific characteristics and parameters (e.g., read and write speed, frequency, latency, etc.) of the volatile memory. For example, even for the same mod- It is to be appreciated that operation of the controller module can be changed by using the metadata, without revising the controller module. In contrast, conventional systems and controller modules relies on hardware update, where specific operating instruction and firmware is hardwired to the controller module chip. To make changes, conventional systems require actual chip revision to modify or otherwise change operation of controller module or iSC system as a whole.

According to various embodiments of the present invention, metadata is used to alter iSC system operations in a persistent way. More specifically, altered the changes (by way of changing register values and/or metadata) to the operations remain in effect over power cycling and chip reset. For example, this effectively can be used as bug fixes without the actual chip revisions.

As shown in FIGS. 1 and 2 and explained above, operations of an iSC system are largely dictated by the controller module (e.g., controller module 102). Typically, the controller modules are normally controlled by hard coded hardware state machines embedded inside the controller module chip. For example, the controller module chips follow predefined sequences to execute various commands to achieve SAVE, RESTORE, and other operations. Table 2 below shows an example of the iSCO1 command execution sequences. More specifically, Table 2 is an operation table as it dictates how each operation, such as a SAVE or RESTORE, is achieved by executing a sequence of individual commands. Similarly, each individual command, such as W_Meta in a SAVE sequence, is further decomposed into predefined bit and byte fields for execution. A collection of the decomposed command entries is a command table. Note that W_Meta (write metadata) is executed as part of the command sequences for the SAVE and RESTORE operations while R_Meta (read metadata) is executed as part of the command sequence for the INIT operation.

TABLE 2

| | | | CMD Sequence | | | | | | | |
|---|---|---|---|---|---|---|---|---|---|---|
| OP # | OP Name | nv_cmd | #0 | #1 | #2 | #3 | #4 | #5 | #6 | #7 | #8-11 |
| 0 | SAVE | 2 | ComReset ~skip_comreset | W_Meta write | W_Chunk | W_Meta | F1 | EOC | | | |
| 1 | RESTORE | 3 | ComReset ~skip_comreset | W_Meta | R_Chunk | W_Meta | F2 | EOC | | | |
| 2 | TRIM | 6 | ComReset ~skip_comreset | Trim | EOC | | | | | | |
| 3 | DMCODE | 7 | ComReset ~skip_comreset | DMcode | EOC | | | | | | |
| 14 | ... | n/a | ComReset use_comreset==1 | SetSRST use_srst==1 | ClrSRST use_srst==1 | EOC | | | | | |
| 15 | INIT | n/a | ComReset | SetSRST srst_en==1 | ClrSRST srst_en==1 | ID | Unlock ssd_locked==1 | ID2 ssd_locked==1 | R_Meta | EOC | | els, each SDRAM memory chip may perform differently. In various embodiments, the controller module obtains performance information that is specific to the memory chip that it interfaces, and adjust its operations accordingly. For example, various parameters and characteristics are stored at "SDRAM control". Accordingly, training data registers "Context Training" store parameters of memory module at different contexts (e.g., different voltage level, capacity level, threading, etc.).

Table 3 provides an example of command table entry. It is to be appreciated that while it is possible to change the command operational table and consequence, changing microprocessor instruction set or how instructions are actually executed is typically not possible. For example, to change Cmd_0 and how it works, it is possible to change the sequence of actions performed by the microprocessor (e.g., microprocessor of the controller module, or the state machine of the controller module), the microprocessor itself cannot change its instructions.

TABLE 3

| Cmd_0 | Features (7:0) | Command | C R R S | PRDT.DBA | FISType |
|---|---|---|---|---|---|
| | Device | LBA (23:16) | | LBA (15:8) | LBA (7:0) |
| | Features (15:8) | LBA (47:40) | | LBA (39:32) | LBA (31:24) |
| | Control | CH | | Count (15:8) | Count (7:0) |
| | | | P* C B R W CFL | | |

It is to be appreciated that to enable changing of controller module operation by changing operating parameters, the controller module uses these parameters when operating. In an embodiment, the controller module comprises an operation table (e.g., Table 2) and a command table (e.g., Table 3). Depending on the specific implementation, the operation table and the command table can be stored as registers or an internal memory. According to an embodiment, an internal SRAM is used to store both the operation table and command table. As shown in FIG. 2, a hardware state machine retrieves 222 the entries from the SRAM 221 and executes each individual command as well as the entire command sequence for an operation. For example, a command stored at the command table refers to one or more instructions that are executable by the microprocessors or FSM, and operation stored at the operation table refers to a sequence of one or more commands to be executed. It is to be appreciated that, given the relatively small instruction set, an operation and command table can be stored in a relatively small memory space. Table 4 shows an operation and command Table RAM implementation using a 256×32-bit SRAM.

embodiment, the controller module comprises a non-volatile memory or hardwired command and operation sets that can be readily loaded into the command and operation tables. For example, in a default operation, the command and operation tables (e.g., stored at RAM or registers) are is initialized with predefined command sequences and commands by the hardware in the system after chip power-on reset as part of the chip initialization. The command and operation tables are protected and software has no access to it in normal mode of operations. This protection is to avoid inadvertent changes to the sequences or commands that are vital to the system operations. In an embodiment, a Table-Overwrite-configuration bit is provided to enable software to overwrite the command and operation tables, should a change to the commands or command sequences is required due to any issue with predefined commands or command sequences. It is to be appreciated that updating the command and operation tables provides capability of fixing operation issues after chip is made.

The ability change controller module and system operation by updating the command and operation table is a useful

TABLE 4

| Entry | Description | Content (32-bit) | | | | | | |
|---|---|---|---|---|---|---|---|---|
| 0 | Cmd_0 | Features (7:0) | Command | C | R R S | PRDT.DBA | | FISType |
| 1 | | Device | LBA (23:16) | | | LBA (15:8) | | LBA (7:0) |
| 2 | | Features (15:8) | LBA (47:40) | | | LBA (39:32) | | LBA (31:24) |
| 3 | | Control | CH | | | Count (15:8) | | Count (7:0) |
| | | | P* C B R W CFL | | | | | |
| 4-7 | CmdTable[1] | | similar to CmdTable[0] | | | | | |
| 8-11 | CmdTable[2] | | | | | | | |
| ... | ... | | | | | | | |
| 124-127 | CmdTable[31] | | | | | | | |
| 128 | OpTable[0] | R  R | CMD #0  CMD #1 | CMD #2 | CMD #3 | CMD #4 | | CMD #5 |
| 129 | | CMD #6 | CMD #7 | CMD #8 | CMD #9 | CMD #10 | CMD #11 | R  R |
| 130-131 | OpTable[1] | | similar to OpTable[0] | | | | | |
| 132-133 | OpTable[2] | | | | | | | |
| ... | ... | | | | | | | |
| 158-159 | OpTable[15] | | | | | | | |
| 160-191 | Reserved | | For debugging purpose | | | | | |
| 192-255 | Received FIS | | Received FIS Structure | | | | | |

As an example, Table 4 provides information for both commands and operations. For example, the content of Table 4 is referred to as a "command and operation table". It is be appreciated that since the command and operation table can be changed, new commands and operations can be added during the update process, thereby allowing change and augmentation of controller and system functions. As mentioned above, compared to FPGA based NVDIMM, functions and behavior of the controller module and isolated controller NVDIMM can be changed and updated conveniently and quickly.

Since the command and operation tables are stored at the RAM or registers of the controller module, a default set of commands and operations are provided, in case the RAM or the registers are not properly initialized. It is to be appreciated that RAM memory is characterized by high read and write speeds, which allows the commands and operations stored within to be accessed and updated quickly. In various feature. It is to be appreciated that with the non-volatile memory and the SAVE, RESTORE, and/or operations, the changes to the command and operation table are made persistent over power cycle and chip reset by saving SDRAM or register content containing the command and operation table to nonvolatile memory (e.g., external SSD/Flash memory) as part of the metadata. As explained above, an indicator (e.g., a control bit) is provided to enable this feature. For example, this bit itself is saved as part of the metadata so it is persistent. Once this bit is set, upon subsequent power cycle or chip reset the memory controller system first initializes the operation and command table with metadata retrieved from non-volatile memory (e.g., SSD/Flash memory), as opposed to using predefined command and command sequences. This makes change to the command and operation table, and hence the operations of the memory system as while, persistent. Among other benefits, this operation provides a way for fixing bugs or otherwise updating the controller module operation without a new chip revision.

Figure 3:
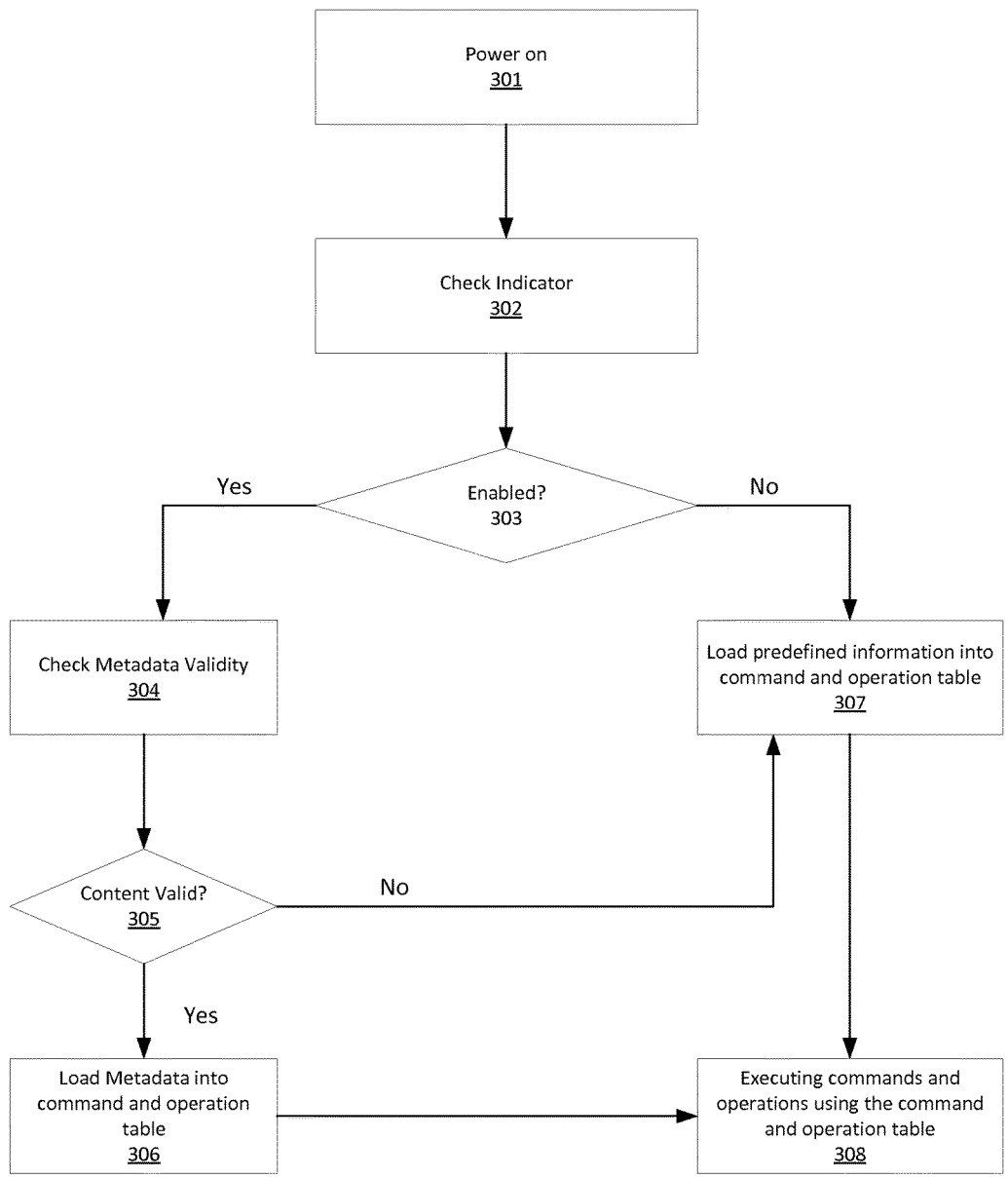
FIG. 3 is a simplified flow diagram illustrating a process for initializing a controller module according to an embodiment of the present invention.

FIG. 3 is a simplified flow diagram illustrating a process for initializing a controller module according to an embodiment of the present invention. This diagram is merely an example, which should not unduly limit the scope of the claims. One of ordinary skill in the art would recognize many variations, alternatives, and modifications. For example, various steps illustrated in FIG. 3 can be added, removed, repeated, modified, replaced, and/or overlapped, which should not limit the scope of claims. For example, the controller module can be controller module 102 in FIG. 1.

At step 301, the controller module is powered on, and the initialization process starts. During the power on process, various components of the controller module is initialized for both electrical characteristics and data. For example, electrical connections and ports thereof are initialized to avoid short, overloading, and/or other potential hazards. Various data registers and memory buffer are cleared and/or set to proper state. Depending on the specific implementation and the configuration of the controller module, other processes may be performed during the power on step.

At step 302, the controller module checks an indicator. For example, the indicator can be a Table-Overwrite-configuration bit described above, which indicates where table overwrite configuration is available and thus should be used instead of hardwired configuration. For example, the indicator is set to "enable" if a command and operation table that is different from the hardwired table has been loaded to the table RAM and/or registers, and is subsequently saved to the metadata area of the nonvolatile memory.

At step 303, the controller module determines where to retrieve controller module configuration from the nonvolatile memory based on the indicator. If the indicator indicates that table overwrite is enabled, the controller module proceeds to step 304. On the other hand, if the indicator indicates that the table overwrite is not enabled, the controller module proceeds to step 307.

At step 304, validity of the metadata is checked. For example, "Signature High" and/or "Signature Low" in Table 1 are checked for metadata validity. It is to be appreciated that even if an updated version of command and operation table has been loaded to the controller module and subsequently used, this updated version of command and operation table might not have been correctly saved to the metadata area of the nonvolatile memory. Loading incorrectly or corrupt command and operation table to the controller module could lead to controller module and system failure.

At step 305, the controller module determines where to retrieve controller module configuration from the nonvolatile memory based on the metadata validity. If the metadata is valid, the controller module proceeds to step 306. On the other hand, if the metadata is invalid, the controller module proceeds to step 307.

At step 306, the controller module load the relevant portion of the metadata stored at the nonvolatile memory to corresponding table RAM and/or registers of the controller module. More specifically, the command and operation table of the controller module is loaded with the metadata stored at the nonvolatile memory. It is to be appreciated that command and operation table is typically relatively small (e.g., less than a few kilobytes) and thus can be loaded from nonvolatile memory to the controller module table RAM and/or registers quickly.

Now referring back to step 303. As explained above, if the indicator indicates that the table overwrite is not enabled, the controller module proceeds to step 307. At step 307, predefined information (e.g., information hardwired to the controller module) is loaded to the command and operation table of the controller module. For example, predefined information is stored at a permanent memory location of the controller. It is to be appreciated that the predefined information provides a backup in case the updated information is corrupt or incorrect. For example, in a scenario where the updated command and operation table does not function properly, resetting the controller would force the controller module to load the predefined information to the command and operation table, thereby reverting to earlier settings.

At step 308, the controller module operates according to command and operation table.

It is to be appreciated that additional steps may be performed as well. For example, at step 302, in addition to checking the indicator, the controller module may additional check the status of command and operation table. Similarly, the process of copying the stored metadata from the nonvolatile memory to corresponding registers and/or table RAM of the controller module (e.g., step 306) may entail copying more than command and operation table data. There can be other variations as well.

Figure 4:
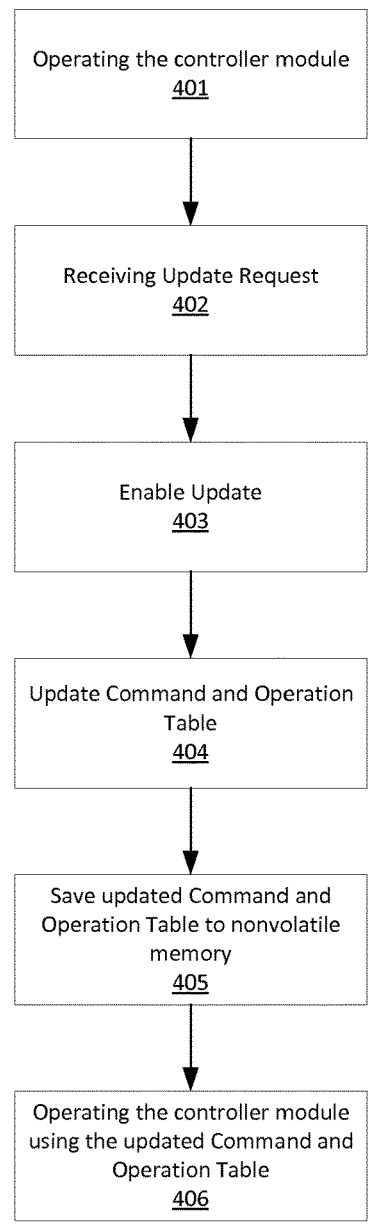
FIG. 4 is a simplified diagram illustrating a process for updating a controller module according to an embodiment of the present invention.

FIG. 4 is a simplified diagram illustrating a process for updating a controller module according to an embodiment of the present invention. This diagram is merely an example, which should not unduly limit the scope of the claims. One of ordinary skill in the art would recognize many variations, alternatives, and modifications. This diagram is merely an example, which should not unduly limit the scope of the claims. One of ordinary skill in the art would recognize many variations, alternatives, and modifications. For example, various steps illustrated in FIG. 3 can be added, removed, repeated, modified, replaced, and/or overlapped, which should not limit the scope of claims. For example, the controller module can be controller module 102 in FIG. 1.

At step 401, the controller module operates as normal. Among other things, the controller module operates according to the command and operation table stored at the table RAM and/or registers. As a part of the command module operation, it receives instructions or indication from one or more communication port if the command and operation table is to be updated.

At step 402, an update request is received. For example, the update request is received through a system service port that is specific used for receiving system updates and/or other information. For example, update request specifically indicates that the operation of the controller module is temporarily on hold for the update to take place.

At step 403, updating of the command and operation table is enabled. For example, a Table-Overwrite-configuration bit is provided to enable software to overwrite the command and operation table. At step 403, the configuration bit is set to enable overwriting of the command and operation table.

At step 404, the command and operation table is updated. For example, through the system communication port, the controller receives the update for the command and operation table, and load the updates to the command and operation table. In a specific implementation, the update is loaded to the table RAM and/or registers for the command and operation table.

At step 405, the updated command and operation table is saved to the nonvolatile memory. It is to be appreciated that this operation is different from the SAVE operation described above. More specifically, the SAVE operation is triggered by system failure event, typically when host is not operational. In contrast, step 405 is performed during the normal operation of the system. For example, while the host controller operates normally, the controller module stores the updated command and operation table to the non-volatile memory. It is to be appreciated that since the command and operation table is relatively small (e.g., a few kilobytes), the process of storing the updated command and operation has minimal affect to system performance.

At step 406, the controller module operates using the updated command and operation table. Depending on the application, the loading of command and operation table can be performed quickly to allow the updated command and operations to be used.

It is to be appreciated additional steps may be performed. Also, sequence of steps described in FIG. 4 may be rearranged. There may be other operations as well.

Figure 5:
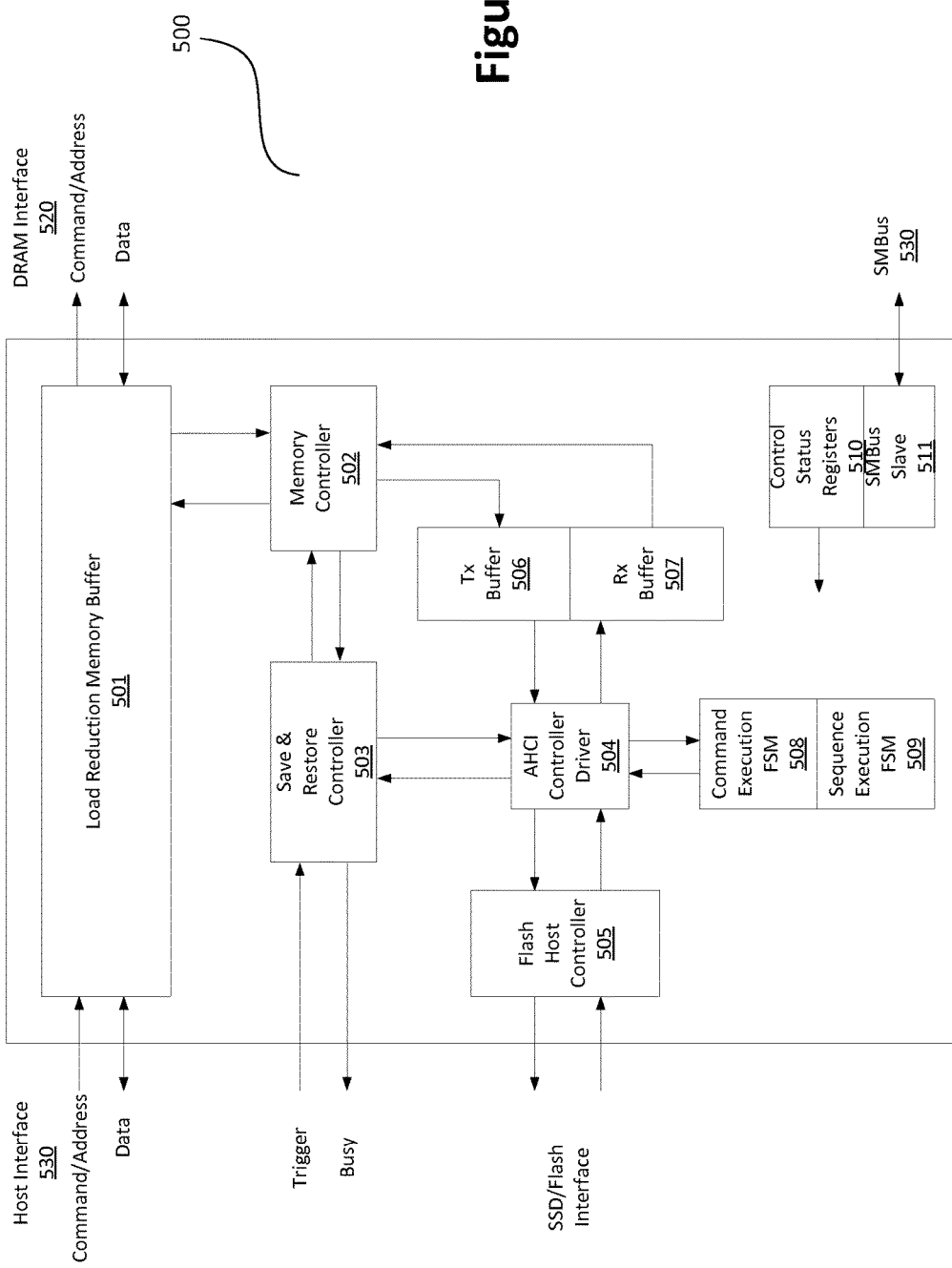
FIG. 5 is a simplified diagram illustrating a controller module 500 according to an embodiment of the present invention.

It is to be appreciated that the controller module for the memory system can be implemented in various ways. FIG. 5 is a simplified diagram illustrating a controller module 500 according to an embodiment of the present invention. This diagram is merely an example, which should not unduly limit the scope of the claims. One of ordinary skill in the art would recognize many variations, alternatives, and modifications. As an example, the memory controller module 500 uses a data path illustrated in FIG. 2 and can execute the processes illustrated in FIGS. 3 and 4.

The controller module 500 includes a buffer 501, which provides a data path and electrical buffer. As shown in FIG. 5, the buffer 501 comprises a load reduction memory buffer. For example, the buffer 501 is integrated as a part of the controller module chip. The buffer 501 is connected to the host interface 530 and the volatile memory (e.g., DRAM) interface 520. Through the buffer 501, data from a host system can be transmitted to the volatile memory. Additionally, the buffer 501 provides electrical buffer to reducing the loading power of on the I/O, thereby improving system efficiency and reliability.

The controller module 500 further includes a memory controller 502. It is to be appreciated the memory controller 502 is configured to operate when the host is not operating. For example, in normal operation mode, the host provides control functions for moving information back and forth between the host and the volatile memory; in failure mode (e.g., power down), the host is incapable of providing control functions, and the memory controller 502 takes over and provides control function for moving information (e.g., backing up information stored at the volatile memory to the non-volatile memory). In various implementations, the memory controller 502 is configured to operate at a high speed to quickly move data from the volatile memory to the non-volatile memory for backup. For example, in failure mode, the volatile memory has limited residual power (or back up power provide by a backup power module) for self-refresh and keep data alive, and the residual power of the volatile memory dictates the time window, during which the memory controller can back information stored at the volatile memory. For example, in failure mode, the memory controller 502 causes the data stored at the volatile memory to be transferred from the interface 520 to the volatile memory. In certain embodiments, the memory controller 502 can also reprogram the volatile memory. Additionally, the memory controller 502 may operate during normal operating mode for backing up data to the non-volatile storage.

The controller 503 provides save and restore functions. More specifically, the controller 503 is configured to receive indication of triggering event (e.g., power failure, power one, etc.). Among other features, the controller 503 facilitates and coordinates save and restore processes with other controllers of the controller module 500. As a part of the save and restore functions, the controller module 503 stores command and operation table to the corresponding memory location of the metadata area of the nonvolatile memory.

The controller 503 is connected to the driver 504. For example, the driver 504 comprises an advanced host controller interface (AHCI) driver, which provides interfacing with the host. For example, the driver 504 provide driving functions for the host controller. According to various implementations, the driver 504 receives commands from the FSMs (e.g., FSM 508 and FSM 509) to executable instructions for various controllers of the of the controller module 500. For example, the commands include command execution and sequence execution. It is to be appreciated the driver 504 may include other modules addition to or instead of the AHCI driver. According to various embodiments, the driver 504 executes commands and operations according to a command and operation table, as described above. For example, commands received from the FSM 508 and operations (or sequences) received from the FSM 509, the driver 504 looks up the command and operation table as how to execute these commands and operations. By changing the command and the operation table, the execution of commands and operations by the driver changes accordingly.

The driver 504 is connected to the controller 505. The controller 505 comprises a non-volatile memory (e.g., SSD/flash) interface. The controller 505 provides controller and I/O functions with the non-volatile memory. For example, during a SAVE event, the content of the volatile memory is copied to the non-volatile memory via the controller 505; during a RESTORE event, the content of the non-volatile memory is copied to the non-volatile memory, also via the controller 505. Depending on the specific implementation, the controller 505 may also causes the command and operation table to be saved to the nonvolatile memory (e.g., in an update event).

The drive 504 is connected to the memory controller 502 via Tx buffer 506 and the Rx buffer 507. According to various embodiments, the Tx buffer 506 and the Rx buffer 507 are data buffers implemented using high speed volatile memory devices (e.g., SRAM). It is to be appreciated that the data buffers Tx buffer 506 and the Rx buffer 507 provide speed matching between the non-volatile memory and the volatile memory. For example, volatile memory typically operates much faster (e.g., 20 times or higher) than non-volatile memory. To transfer data between non-volatile memory and volatile memory, data are first buffer at the Tx buffer 506 and the Rx buffer 507 so that the non-volatile memory can transfer a block (instead of a stream) of data at a time. For example, the Tx buffer 506 and the Rx buffer 507 allows for data throttling and burst mode operation. The Tx buffer 506 and the Rx buffer 507 can be used to keep the non-volatile memory operating at a stable speed, while conserving power consumption for the volatile memory.

The controller module 500 additionally includes an SMBus 511. For example, the SMBus 511 is implemented as a serial bus operating in slave mode. Among other features, the SMBus 511 provide an interface for accessing the controller module 500, and can be used for program and updating various functions of the controller module 500. In various embodiment, the SMBus 511 provides a system service communication interface, which can be used for receiving various types of firmware and instruction update.

For example, the SMBus 511 receives system updates for changing the command and operation table.

The register block 510 comprises a number of registers, and is used by various controllers (e.g., controllers 503, 502, 505, etc.) and/or other components. For example, the registers are used to store various parameters and settings need for operating various controllers and components of the controller module 500. As an example, the register block 510 provides the function for the register module 224 is FIG. 2. According to certain embodiments, the register block comprises an SRAM for storing the command and operation table.

It is to be appreciated that the controller module 500 can be implemented in various ways, and FIG. 5 merely provides an simplified functional block diagram. Various components may be added, removed, replaced, or modified.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A memory system comprising:
    a non-volatile memory, the non-volatile memory comprising a data area and a metadata area, the metadata area being predefined to store register values for a plurality of registers of a controller and a first table, the first table comprising executable commands and operations to be executed by the controller and the register values comprising a first register value to indicate a control parameter of a volatile memory, wherein the control parameter corresponds to at least one of a read speed of the volatile memory, a write speed of the volatile memory, a frequency of the volatile memory, or a latency of the volatile memory;
    the volatile memory operatively coupled to the non-volatile memory;
    a backup power source coupled to the non-volatile memory; and
    the controller operatively coupled to the volatile memory, the backup power source, and the non-volatile memory, the controller comprising a communication interface, a memory block, and the plurality of registers, and the controller being configured to:
        store, in the memory block of the controller, a copy of the first table;
        store, in the plurality of registers, a copy of the register values;
        receive, via the communication interface, an update to change at least one entry in the first table to obtain an updated first table;
        receive, via the communication interface, a second update to change the first register value to an updated register value to change the control parameter of the volatile memory;
        change the first table to the updated first table in the memory block of the controller responsive to the update;
        change the first register value to the updated register value in a first register of the plurality of registers responsive to the second update;
        store a copy of the updated first table at the metadata area of the non-volatile memory such that the change to the first table is preserved after a power cycle of the memory system; and
        store a copy of the updated register value at the metadata area of the non-volatile memory such that the change to the first register is preserved after the power cycle of the memory system.

2. The memory system of claim 1 wherein:
    each command of the executable commands and operations comprises one or more predefined instructions; and
    each operation of the executable commands and operations comprises one or more commands.

3. The memory system of claim 1 wherein the memory block comprises a static random-access memory (SRAM).

4. The memory system of claim 1 wherein the controller comprises at least one of a command Finite State Machine (FSM) or a sequence Finite State Machine (FSM).

5. The memory system of claim 1 wherein the non-volatile memory comprises at least one of a flash memory or a solid state drive.

6. The memory system of claim 1 wherein the metadata area further to store a second table, the second table comprises an earlier version of the executable commands and operations.

7. The memory system of claim 1, wherein the controller is further configured to store an indicator in the memory block of the controller and at the metadata area of the non-volatile memory in connection with the updated first table being stored in the memory block of the controller and at the metadata area of the non-volatile memory, the indicator to enable the updated first table to be retrieved upon a subsequent power cycle of the memory system.

8. The memory system of claim 1, wherein the controller is further configured to set a control bit in the memory block of the controller and to store a copy of the control bit in the metadata area of the non-volatile memory in response to the updated first table being stored at the metadata area of the non-volatile memory, wherein the controller, upon a subsequent power cycle of the memory system, is configured to initialize a memory block of the controller with metadata in the updated first table retrieved from the metadata area of the non-volatile memory.

9. The memory system of claim 1, wherein the controller is further configured to:
    retrieve the updated first table at the metadata area of the non-volatile memory upon a subsequent power cycle of the memory system; and
    execute the at least one operation of the updated first table.

10. The memory system of claim 1, wherein the plurality of registers comprises a second register to store a second register value to indicate a state of the controller, wherein the controller is to store a copy of the second register value at the metadata area of the non-volatile memory such that the change to the second register is preserved after the power cycle of the memory system.

11. The memory system of claim 1, wherein the plurality of registers comprises a third register to store a signature to validate contents of the metadata area of the non-volatile memory, wherein the controller is to store a copy of the signature at the metadata area of the non-volatile memory such that the signature is compared to a hardwired value to validate the contents of the metadata area after the power cycle of the memory system.

12. The memory system of claim 1, wherein the plurality of registers comprises a fourth register to store debugging information, wherein the controller is to store a copy of the debugging information at the metadata area of the nonvolatile memory such that the debugging information is preserved after the power cycle of the memory system.

13. The memory system of claim 1, wherein the plurality of registers comprises a fifth register to store a pointer directed to a location of a copy of contents of the volatile memory that is stored in the non-volatile memory.

14. The memory system of claim 1, wherein the plurality of registers comprises a sixth register to store operation conditions of the controller.

15. The memory system of claim 1, wherein the plurality of registers comprises a seventh register to store context training data at a plurality of different contexts of the memory system, wherein the controller is to store a copy of the context training data at the metadata area of the non-volatile memory such that the context training data is preserved after the power cycle of the memory system.

16. A method of initializing a memory system, the method comprising:
  storing, by a controller of a memory system, a first table, the first table comprising executable commands and operations, the controller being configured to execute the executable commands and operations;
  storing, by the controller, register values in a plurality of registers, wherein the register values comprise a first register value to indicate a control parameter of a volatile memory component of the memory system, wherein the control parameter corresponds to at least one of a read speed of the volatile memory, a write speed of the volatile memory, a frequency of the volatile memory, or a latency of the volatile memory;
  receiving, by the controller, an update to change at least one entry of the first table to obtain an updated first table;
  receiving, by the controller, a second update to change the first register value to an updated register value to change the control parameter of the volatile memory;
  changing, by the controller, the first table to the updated first table in a controller memory associated with the controller in response to receiving the update;
  changing, by the controller, the first register value to the updated register value in a first register of the plurality of registers in response to receiving the second update;
  storing, by the controller at a metadata area of a nonvolatile memory component of the memory system, a copy of the updated first table such that the change to the first table is preserved after a power cycle of the memory system;
  storing, by the controller at the metadata area, a copy of the updated register value such that the change to the first register is preserved after the power cycle of the memory system;
  powering on the memory system;
  checking an indicator stored in the metadata area to determine if the first table has been updated to the updated first table;
  in response to determining that the first table has been updated to the updated first table, loading the updated first table from the metadata area of the nonvolatile memory component to the controller memory and loading the updated register value from the metadata area to the first register; and
  operating the memory system using the updated first table and the updated register value.

17. The method of claim 16, further comprising storing, by the controller, a second table, the second table comprising a different version of the executable commands and operations.

18. The method of claim 16 further comprising checking a validity of the updated first table stored at the nonvolatile memory.

19. A method of changing commands and operations for a memory system, the method comprising:
  operating a controller using at least a first table stored at a first memory location and a first register value stored in a first register, the first table comprising executable commands and operations and the first register value indicating a control parameter of a volatile memory component of the memory system, wherein the control parameter corresponds to at least one of a read speed of the volatile memory, a write speed of the volatile memory;
  receiving a first request to change at least one entry in the first table to obtain an updated first table;
  receiving a second request to change the first register value to an updated register value;
  setting an indication that the first table is updated to the updated first table in response to the request;
  receiving data for updating the first table;
  checking a validity of the data;
  in response to the first request, store the updated first table in the first memory location and a copy of the updated first table at a second memory location in a non-volatile memory associated with the controller such that the change to the first table is preserved after a power cycle of the memory system;
  in response to the second request, store the updated register value at the second memory location in the non-volatile memory such that the change to the first register value to the updated register value is preserved after the power cycle of the memory system; and
  operating the controller using at least the updated first table and the updated register value.

20. The method of claim 19, wherein the indication comprises a predefined bit to enable updating the first table.

* * * * *